United States Patent
Wagner et al.

(10) Patent No.: US 6,391,377 B1
(45) Date of Patent: *May 21, 2002

(54) PROCESS FOR VACUUM TREATING WORKPIECES, AND CORRESPONDING PROCESS EQUIPMENT

(75) Inventors: Rudolf Wagner, Fontnas (CH); Jacques Schmitt, La Ville du Bois; Jerome Perrin, Paris, both of (FR)

(73) Assignee: Unaxis Balzers Aktiengesellschaft, Fuerstentum (LI)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/441,374

(22) Filed: Nov. 17, 1999

Related U.S. Application Data

(63) Continuation of application No. 08/889,799, filed on Jul. 8, 1997, now abandoned.

(51) Int. Cl.[7] ................. B65G 49/07; C23C 14/54; C23C 16/52
(52) U.S. Cl. ............. 427/8; 204/192.12; 204/192.13; 204/192.32; 204/192.33; 216/59; 216/67; 427/255.28; 427/294; 427/585
(58) Field of Search ............... 427/8, 255.28, 427/294, 585; 118/50, 500, 668, 676, 712, 719, 723 NW, 729; 204/192.12, 192.13, 192.32, 192.33, 298.02, 298.03, 298.25, 298.31, 298.32, 298.35; 216/59, 67; 156/345; 414/217, 222, 225, 939

(56) References Cited

U.S. PATENT DOCUMENTS

| | | | | |
|---|---|---|---|---|
| 5,019,233 A | * | 5/1991 | Blake et al. | 204/192.12 |
| 5,167,716 A | * | 12/1992 | Boitnott et al. | 118/719 |
| 5,344,542 A | * | 9/1994 | Maher et al. | 204/298.15 |
| 5,590,994 A | * | 1/1997 | Schertler | 414/217 |
| 5,693,238 A | * | 12/1997 | Schmitt et al. | 216/67 |

FOREIGN PATENT DOCUMENTS

| | | |
|---|---|---|
| DE | 4412902 A1 | * 11/1994 |
| EP | 608620 B1 | * 8/1996 |

* cited by examiner

*Primary Examiner*—Leo B. Tentoni
(74) *Attorney, Agent, or Firm*—Crowell & Moring LLP

(57) ABSTRACT

A method of manufacturing workpieces, includes loading the workpieces into a treatment facility, surface treating the workpieces in at least one vacuum station of the facility grouped as a station batch and controlling at least the timing of the process by a freely programmable process controller unit. At least two stations operating each on workpiece batches can be grouped as respective station batches and be different with respect to number of workpieces. The workpieces can be transported to and from the grouped stations. An embodiment of vacuum treatment system for such a process includes at least one vacuum treatment station for workpieces grouped as a station batch. A transport system supplies the vacuum station with workpieces. A process controller unit has an output operationally connected to a drive arrangement for the transport system. The unit controls operating timing of the treatment system and is freely programmable.

13 Claims, 9 Drawing Sheets

PROCESS FOR VACUUM TREATING WORKPIECES, AND CORRESPONDING PROCESS EQUIPMENT

CROSS-REFERENCE TO RELATED APPLICATIONS

This application is related to application Ser. No. 08/956,030 filed on Oct. 22, 1997 in the name of Rudolf WAGNER et al. for PROCESS FOR HANDLING WORKPIECES AND APPARATUS THEREFOR; the subject matter of which is incorporated herein by reference.

This application is a continuation of application Ser. No. 08/889,799, filed Jul. 8, 1997, now abandoned.

BACKGROUND OF THE INVENTION

The present invention relates to processes for the vacuum treatment of workpieces as well as to corresponding process.

A group of several workpieces is subsequently referred to as "batch".

The simultaneous vacuum treatment of entire batches has been known for a long time. The traditional procedure was to load a vacuum chamber with a batch, to pump down the vacuum chamber and to treat the batch inside the vacuum chamber. After the treatment process the vacuum chamber was vented, opened and the treated batch removed.

This procedure is limited to processes in which a batch treatment can be performed consecutively, usually with intermediate phases in normal atmosphere. This means that such a batch treatment is not feasible for workpieces that require a series of vacuum treatment steps, all or most of which must fulfill demanding cleanliness requirements. For this type of critical process sequences a different treatment technique has been developed in which the workpieces are loaded through a vacuum lock and, without leaving the latter, are subjected to a series of treatment process steps such as coating processes in all known vacuum engineering versions including CVD, LPCVD, PECVD, PVD, as well as etching processes, cleaning processes, heating or cooling processes.

From U.S. Pat. No. 5,344,542, for example, a known solution is to submit workpieces from a load lock hopper station via a centrally arranged vacuum transport chamber to several connected treatment stations for which purpose a transport robot is used in the transport chamber. To minimize cross-contamination between the individual treatment steps in the treatment stations through the transport chamber, the treatment stations can be vacuum isolated relative to the transport chamber by means of valves. The workpieces are transported individually to the desired process stations via the transport chamber.

If different types of treatment stations that satisfy specific requirements are flanged to such a transport chamber this also results in different requirements with respect to the time sequence based on which the individual workpieces must travel through the individual treatment stations, and also with respect to the treatment time to which the individual workpieces are subjected at the corresponding treatment stations. To achieve flexibility in subjecting the individual workpieces to the intended treatment, U.S. Pat. No. 5,344,542 also proposes to make the robot arrangement interact with a process controller at which the required time sequence based on which the treatment stations are served by the robot arrangement can be freely defined.

Also known from U.S. Pat. No. 5,019,233 is the application of the single workpiece treatment principle to highly complex and critical workpiece treatments under vacuum condition, and in particular to treatment steps that are highly sensitive to contamination as discussed in connection with U.S. Pat. No. 5,344,542. It is acknowledged, however, that the workpieces after they have been loaded into an input lock, must first be conditioned, that is, degassed in such a way that subsequently they do no introduce absorbed external gasses as contamination into the highly critical processes. If according to U.S. Pat. No. 5,019,233 this necessary conditioning of the workpieces is performed when they are loaded through the vacuum lock, relatively long conditioning times are required. The vacuum lock becomes the slowest element of the process sequence and significantly limits the throughput of a corresponding treatment plant.

There the problem is solved in such a way that two load locks are operated in parallel. A workpiece batch is transported into the first load lock where it is conditioned and subsequently transferred into a second vacuum lock. From the latter one workpiece at a time is distributed via the central transport chamber to the appropriate treatment stations, again in a user selectable sequence, while already the next batch is loaded and conditioned in the first vacuum lock. For sequencing the highly delicate process steps in the treatment stations, the aforementioned single workpiece treatment process is still followed. Only for loading through the vacuum lock and for conditioning as well as for unloading the workpieces are grouped into batches.

A similar procedure is followed according to EP 0 608 620. Basically also there the workpieces are to be subjected to a complex sequence of individual, critical vacuum treatment steps. Also in this case the aforementioned concept of loading and unloading the workpieces in batch mode through the vacuum lock and subjecting the workpieces individually to the various treatment steps is still maintained.

According to that patent application thin glass substrates are to be treated. An acute breakage problem is said to exist if such substrates are exposed to abrupt temperature changes. However, if such glass substrates are to be individually heated and cooled gradually in single workpiece treatment mode, the throughput of the overall system is significantly impaired as already mentioned in U.S. Pat. No. 5,019,233. As in the case of U.S. Pat. No. 5,019,233 also here the slowest steps of the process sequence, that is, gradual heating and gradual cooling are still performed in batch mode. Besides, these are process steps that are rather uncritical. Also according to this application a batch of workpieces is loaded through the vacuum lock and the loaded batch is then slowly heated as a batch in a heating station. Subsequently, however, the workpieces are transported individually to the various treatment stations and then collected as a batch in the exit chamber where they are gradually cooled before they are unloaded to atmosphere.

As can be seen, the concept of treating each workpiece requiring a complex sequence of process steps individually, that is, one workpiece at a time, was systematically followed. One of the major reasons for this was also the prevailing opinion that with a complex sequence of process steps and relatively costly workpieces to be treated, only individual workpiece treatment was suitable for achieving adequate control over the processes and for controlling, monitoring and reproducing the process sequence, and in addition to limit the damage to a few workpieces in the event of a process fault.

As far as is known DE-OS 44 12 902 was the first application which proposed that also in such highly delicate workpiece treatment processes the workpieces should not only be loaded and unloaded through vacuum locks in batch mode, but also be submitted as a batch to a central transport chamber, from where they are submitted to and handled as batches in the various treatment stations. For further increasing the throughput, several identical or identically operated treatment stations are operated in parallel.

Under a first aspect the present invention is akin to a process or a system of the last mentioned type. As mentioned above, the workpieces are loaded and unloaded through vacuum locks in batch mode, transported, and submitted in parallel to several identical treatment stations. The objective of the present invention is to give this approach a high degree of adaptation flexibility for different process sequences while preserving the high production rate in said workpiece treatment even in situations where within the framework of the desired flexibility very critical, highly divergent process steps must be implemented in a complex sequence.

When at least one vacuum station is available in which the workpieces are surface treated, that is, coated or eroded in batch mode, this is achieved by means of a process controller through which the timing for feeding and removing the workpieces to and from the corresponding vacuum stations is freely definable.

This breaks with the prevailing opinion that batch processing of workpieces, which is pursued by this invention by means of a definable sequence of treatment steps for highly complex treatment process sequences, cannot be efficiently implemented even with flexibly selectable, difficult process steps.

The process according to the present invention and the corresponding process equipment according to claim 1 and 15 respectively make it possible to selectively configure with the same basic equipment a variety of different batch treatment processes or treatment sequences according to user specifications or even in accordance with the requirements of individual product series. With the same basic batch configuration and despite the resulting high throughput, the configuration flexibility advantages known only for single workpiece treatment systems can be achieved and thus it becomes possible to implement process steps and in particular process step sequences in batch mode which in the past were the exclusive domain of single workpiece treatment.

Given the said application flexibility of one and the same system, a second aspect of the present invention is based on the following insight: If on a treatment system two or more vacuum stations are installed into which the workpieces are loaded as batches in accordance with the aforementioned concept, the situation may occur in which the batch size on one or the other installed vacuum station should be smaller than on another vacuum station, depending on its type and implementation effort.

In this respect reference can be made to U.S. Pat. No. 5,590,994. On the system known from this patent application the first vacuum station in this sense is a transport station featuring a transport carrousel holding the batch of workpieces. Before the workpieces are transferred from the transport carrousel batch to a subsequent transport robot from which they are supplied to the individual treatment stations in single workpiece mode, they are deposited by the former in a large conditioning chamber. There, a much larger workpiece batch is accommodated than in the aforementioned transport chamber. The conditioning chamber is operated cyclically, that is, from said transport chamber a workpiece is inserted into the conditioning chamber while at the same time a previously conditioned workpiece is retrieved. This shows that already in said patent application it was realized that it can be highly advantageous to use batch mode vacuum stations that accommodate batches of different sizes. As mentioned, however, the treatment as well as the transport between the two vacuum stations of different batch size are performed in single workpiece mode.

Under this second aspect the objective of the present system is to modify the process of the aforementioned type in which always at least two vacuum stations for different batch sizes are provided, so that a higher throughput of the overall system is achieved than with the single workpiece transfer and treatment process implemented in the known system. With the process according to claim 2 and the equipment according to claim 16 this is achieved by implementing the transport to and/or from the stations accommodating different batch sizes in batch mode, that is, not as one workpiece at a time to or from said stations but simultaneously with several workpieces, that is, a transport batch.

This preserves the possibility to process different batch sizes, depending on the installed vacuum station type while still systematically following the batch handling principle. In this way, for example, a vacuum station designed as a vacuum lock can be designed for a very large batch and the transport robot removes, quasi as a portion, a smaller batch from the vacuum lock batch and transports it to the corresponding treatment station which should be designed in such a way that not all workpieces of the vacuum lock batch can be treated simultaneously.

As shall be explained later an additional step of the present invention is to vary also the size of each transported batch under process control which in systems with several vacuum stations accommodating different batch sizes gives the possibility to optimize the entire process sequence, that is, as a function of the batch source from which a transport to a specific destination batch must be accomplished. This aspect of the invention occasionally controls also a "batch size 1" and consequently a single work piece.

Under this third aspect the present invention which aims to achieve maximum application flexibility combined with optimum throughput is aware, for example, based on U.S. Pat. No. 5,590,994, that with vacuum stations of different batch sizes at least two vacuum stations with such different batch sizes can be provided for which the loading and/or unloading with one and the same transported batch size is, however, not optimal. For example, if the one vacuum station to be loaded is designed for a batch size of nine and the second one for a batch size of ten, it is obvious that one and the same transport batch size, be it either three or five, is not suited to be used rigidly for both stations. Under this aspect the present invention proposes in accordance with the wording of claim 3 that in a workpiece treatment process comprising at least two vacuum stations in which the workpieces are accommodated as batches, to load or unload these vacuum stations with workpiece batches, the size of which can be controlled. If these two stations are supplied, for example, by the same transport robot, it is proposed, for example, to provide means for the latter through which the number of workpieces to be picked up by the robot can be controlled for each operating cycle.

A system designed according to this aspect is specified in claim 17.

Preferably also here the transport batch size sequence is freely definable by means of a process controller, or optimized by such a controller based on parameters such as station batch sizes and process step sequences.

As mentioned it is feasible to reduce the transport batch size to a single workpiece, if this is required.

Under a fourth aspect of the present invention it is recognized that if one and the same basic equipment configuration is used for building different overall configurations, it should be noted that—as discussed under the third aspect—vacuum stations can also be designed for different batch sizes. According the wording of claims 4 and 18 it is proposed that the number of workpieces of the station batches shall be freely definable by a process controller. If, for example, a vacuum station with a batch size of ten is installed at one of the work openings of a transport chamber, and on another work opening a vacuum station with a station batch size of five, this can be readily accommodated according to the invention in that the process controller is given information on a case by case basis concerning the station batch size to be expected at the corresponding work opening; the controller can then calculate the optimum transport batch sizes either as fixed or variable quantities.

Other preferred design versions of the present invention under all aspects with respect to the process, contemplates as well as the preferred design version of the equipment.

Preferably at least some of the installed vacuum stations are vacuum isolated from each other, if necessary, in such a way that the possibility of contamination of individual process steps by others is precluded.

The processes according to the invention as well as the corresponding equipment are particularly suitable for treating flat workpiece discs, in particular semiconductor wafers, memory discs, substrates for active displays, basically two-dimensional flat and three-dimensional workpieces, with the latter including, for example, machine components, tools, in particular for metal cutting and shaping, for example, for depositing wear protection coatings.

The invention under all its aspects is subsequently explained by illustrations which serve as examples. These show:

BRIEF DESCRIPTION OF THE DRAWINGS

In FIG. 1 which is a schematic sequence chart the principle of a first procedure according to the first aspect of the present invention is shown.

Figure 1:
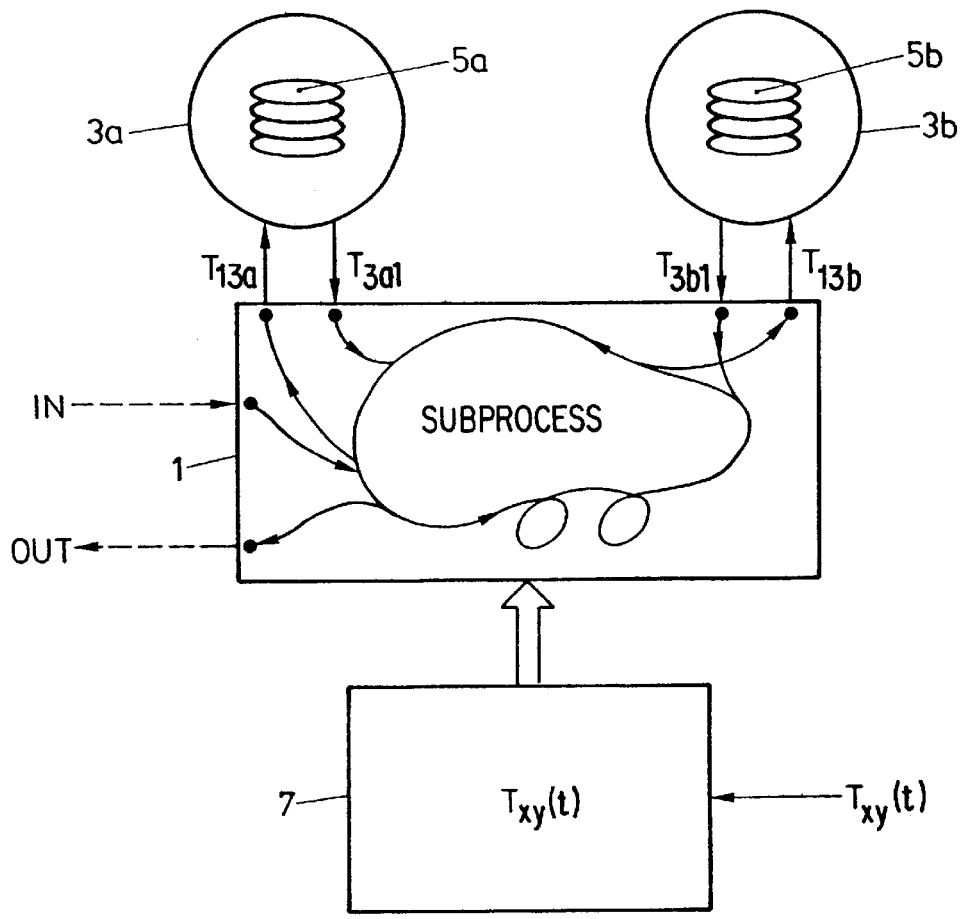
FIG. 1 In the form of a schematic sequence chart a system according to the invention or a process according to the invention in which the sequence in which the batch vacuum stations are served can be freely defined on a process controller.

A complex vacuum treatment process for workpieces in which already treatment steps such as transporting, loading and unloading through the vacuum lock, as well as CVD, PECVD, LPCVD, PVD treatments can be performed in a sequence that is not of interest here, is summarized in FIG. 1, subprocess block 1. At least one additional part of the total process is performed in at least two schematically represented vacuum treatment stations $3_a$ and $3_b$. Both treatment stations $3_a$ and $3_b$ which can be, for example, CVD, PECVD, LPCVD, PVD coating stations, etching stations, cleaning stations, etc. are designed for accepting one station workpiece batch 5a or 5b. A transport $T_{13a}$ occurs between subprocess 1 and vacuum station $3_a$, conversely a transport T3a1 from station 3a to the remaining process 1, analogously between remaining process 1 and treatment station 3b. Any transports between treatment stations $3_a$ and $3_b$ occur in subprocess 1 as shown in FIG. 1.

According to the invention a process control 7 is provided through which the time sequence of the transport movements is controlled at least between subprocess 1 and preferably the at least 2 batch treatment stations 3a, 3b, as represented by block 7 with $T_{xy}(t)$ which schematically represents the process controller. As the said timing sequence $T_{xy}(t)$ is freely definable, the point in time within the overall process at which treatment station 3a and the time at which treatment station 3b are to be loaded or unloaded, can be chosen as required by the application.

As will be explained later, the loading and unloading process itself can be performed also with batches, transport batches, that are of the same size or of a different size than the station batch size, preferably also on stations 3a, 3b, or it can be performed in single workpiece transport mode, for example, by loading single workpieces into the corresponding station 3 in rapid sequence and preferably consecutively for assembling one of the batches 5a, 5b. The workpieces can be transported together, either by means of holders or magazines, which is in particular the case for batch transport by means of a carrier magazine that defines the transport workpiece batch, where the magazine is designed according to the geometry of the workpieces to be treated.

As mentioned the sequence control is freely definable in subprocess 1, also on other vacuum stations that are not specifically shown, in addition to the sequence specifications with respect to treatment stations 3a, 3b or anywhere else, if desired.

Of course, more than two vacuum stations are preferably provided, the station batch size of which is freely definable and/or the transport batch size of which can be specified as a variable or fixed value. In a complete process stations may also exist that can be operated only in single workpiece mode and/or stations arranged upstream or downstream of the vacuum stations that operate with normal atmosphere. If some single workpiece stations exist, the desired high throughput can be achieved by operating several such single workpiece stations in parallel.

Figure 2:
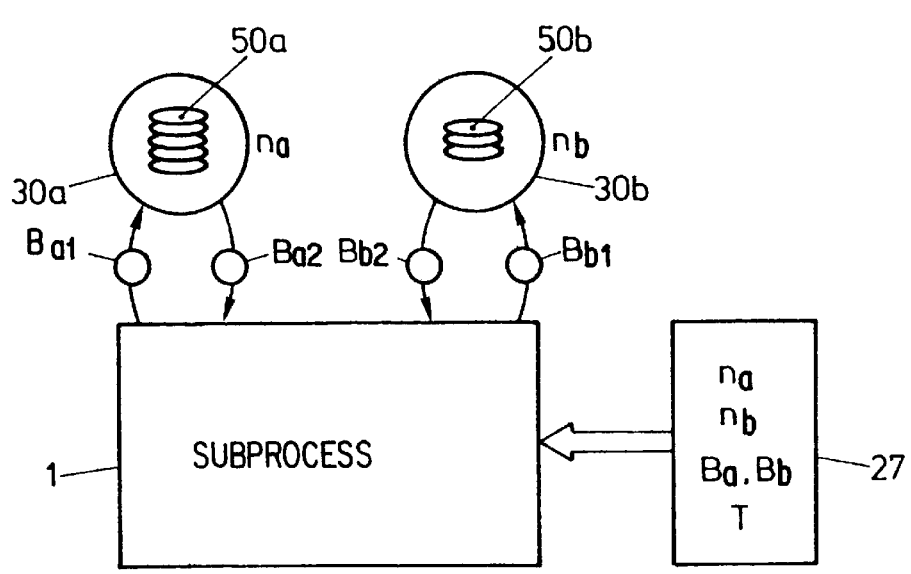
FIG. 2 in a diagram, analogous to FIG. 1, a system employing the process according to the invention in which at least two stations of different station batch size are served by different transport batch sizes.

Analogously to FIG. 1, FIG. 2 shows the procedure according to the invention under the second aspect of the invention. Block 1 again shows a part of the overall process which at the moment is not of immediate interest and in which vacuum stations, cleaning stations, etching stations, coating stations and in particular CVD, PECVD, LPCVD and PVD stations are provided and which can be served with corresponding transport devices on transport stations. Also stations 30a, b may all be stations of said type. Both vacuum stations 30a, b are designed to accommodate one station batch 50a, 50b, each of different size $n_a$ or $n_b$. The workpieces are transported between stations 30 and subprocess 1 by means of transport batch $B_{a1}$, $B_{a2}$ or $B_{b1}$, $B_{b2}$ respectively. Even if the batch sizes in stations 30a, b differ, for example, in accordance with their type, the effect is that at least with respect to the observed stations and subprocess 1, true batch operation and consequently a high throughput is achieved. In the general situation illustrated in FIG. 2 in which the batch sizes $n_a$ and $n_b$ can be varied as desired and in which the transport batches $B_{a1}$, $B_{a2}$ and $B_{b1}$, $B_{b2}$ can also be varied as desired, one or two buffer stations in subprocess 1 must be provided, depending on the station batch sizes. This shall be explained by means of an example in which batch 50a from station 30a of FIG. 2 is to be transported, where $$n_a = 3.5 \cdot n_b \quad \text{a)}$$

$$n_a = 3 \cdot n_b \quad \text{b)}$$

$$n_a = 2 \cdot n_b \quad \text{c)}$$

With the "unit of measure" $B_{a2}$ we thus obtain:

$$B_{b1} = 3/7 \cdot Ba2 \quad \text{a}_1)$$

$$n_b = 6/7 \cdot Ba2 \quad \text{b}_1)$$

$$n_a = 3 \cdot Ba2 \quad \text{c}_1)$$

Figure 3:
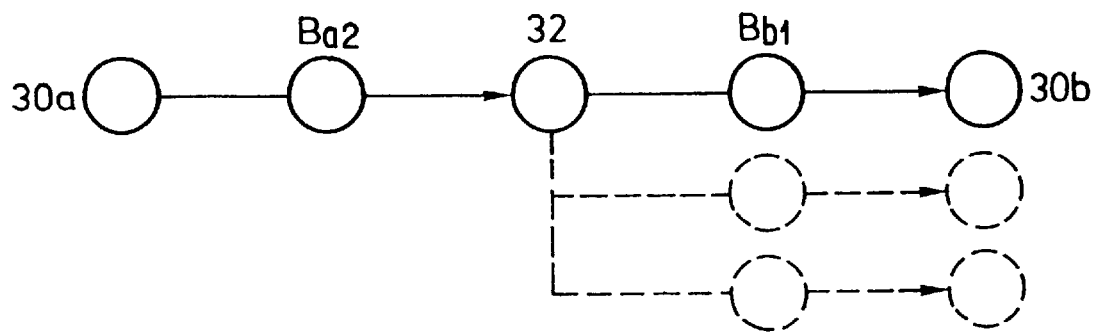
FIG. 3 based on the process illustrated in FIG. 2, a schematic representation of the transport from one station to the other via an additional subprocess station serving as a buffer station.

FIG. 3 shows how a buffer station 32 on subprocess 1 is loaded according to FIG. 1 by station 30a with batch size $Ba_2$, and from there several stations 30b are loaded with the transport batch size $B_{b1}$. The following table, intended as an example, gives a step by step explanation of what batch size will be deposited with the unit of measure $B_{a2}$.

| Step | 30a [Ba$_2$] | Ba2 [Ba$_2$] | Zs [Ba$_2$] | BB1 [Ba$_2$] | 30b [Ba$_2$] | |
|---|---|---|---|---|---|---|
| 0. | 3 | 0 | 0 | 0 | 0 | |
| 1. | 2 | 1 | 0 | 0 | 0 | |
| 2. | 2 | 0 | 1 | 0 | 0 | |
| 3. | 2 | 0 | 4/7 | 3/7 | 0 | |
| 4. | 2 | 0 | 4/7 | 0 | 3/7 | |
| 5. | 2 | 0 | 1/7 | 3/7 | 3/7 | |
| 6. | 2 | 0 | 1/7 | 0 | 6/7 | → full 1. |
| 7. | 1 | 1 | 1/7 | 0 | 6/7 | |

| Step | 30a [Ba$_2$] | Ba2 [Ba$_2$] | Zs [Ba$_2$] | BB1 [Ba$_2$] | 30b [Ba$_2$] | |
|---|---|---|---|---|---|---|
| 8. | 1 | 0 | 8/7 | 0 | 6/7 | |
| 9. | 1 | 0 | 5/7 | 3/7 | 6/7 | |
| 10. | 1 | 0 | 5/7 | 0 | 6/7 / 3/7 | |
| 11. | 1 | 0 | 2/7 | 3/7 | 6/7 / 3/7 | |
| 12. | 1 | 0 | 2/7 | 0 | 6/7 / 6/7 | → full 2. |
| 13. | 0 | 1 | 2/7 | 0 | 6/7 / 6/7 | |
| 14. | 0 | 0 | 9/7 | 0 | 6/7 / 6/7 | |
| 15. | 0 | 0 | 6/7 | 3/7 | 6/7 / 6/7 | |
| 16. | 0 | 0 | 6/7 | 0 | 6/7 / 6/7 / 3/7 | |
| 17. | 0 | 0 | 3/7 | 0 | 6/7 / 6/7 / 6/7 | → full 3. |

From this it is apparent that after 17 transport steps three of the stations 30b are full and that 3/7 of the transport batch size $B_{a2}$ remains in the buffer station. Only with the next execution of the transport from stations 30a to stations 30b will buffer station 32 again be empty as shown in FIG. 3, that is, if two station batches 50a from station 30a have been transported in seven batches 50b for stations 30b. It is obvious that the workpieces in station 30b which is regarded here as the destination station can in the meantime be transported onward, depending on the treatment time, which means that for controlling the process according to the above table the process as a whole must be taken into consideration and the necessary transport steps and their time sequence need to be optimized.

Of course, the situation becomes much simpler but the throughput not necessarily optimal if uniform transport batch sizes are used, that is, according to FIG. 2

$$Ba_1 = Ba_2 = Bb_2 = Bb_1$$

are selected and in this case the station batch sizes are preferably an integer multiple of a transport batch size.

Within the framework of the flexibility aimed at by this invention with respect to the equipment configuration, and in particular when following the concept of the invention that the workpiece transport between the treatment stations in which the workpieces are deposited in batch mode shall occur by means of transport batches, it is apparent that with a more complex system configuration with stations of different batch sizes an optimum, generally applicable transport batch size that is suitable for all stations can in all probability not be found. This is particularly problematic if all configured vacuum stations or some of these stations are grouped around a central transport station with a robot that transports batches from and to the stations in different station batch sizes. To accommodate this aspect and in order to achieve high flexibility, also with respect to process sequence optimization when the transport is performed by means of transport batches, it is proposed as an aspect of the present invention to make the transport batch size controllable. This is explained schematically with the aid of FIG. 4.

Figure 4:
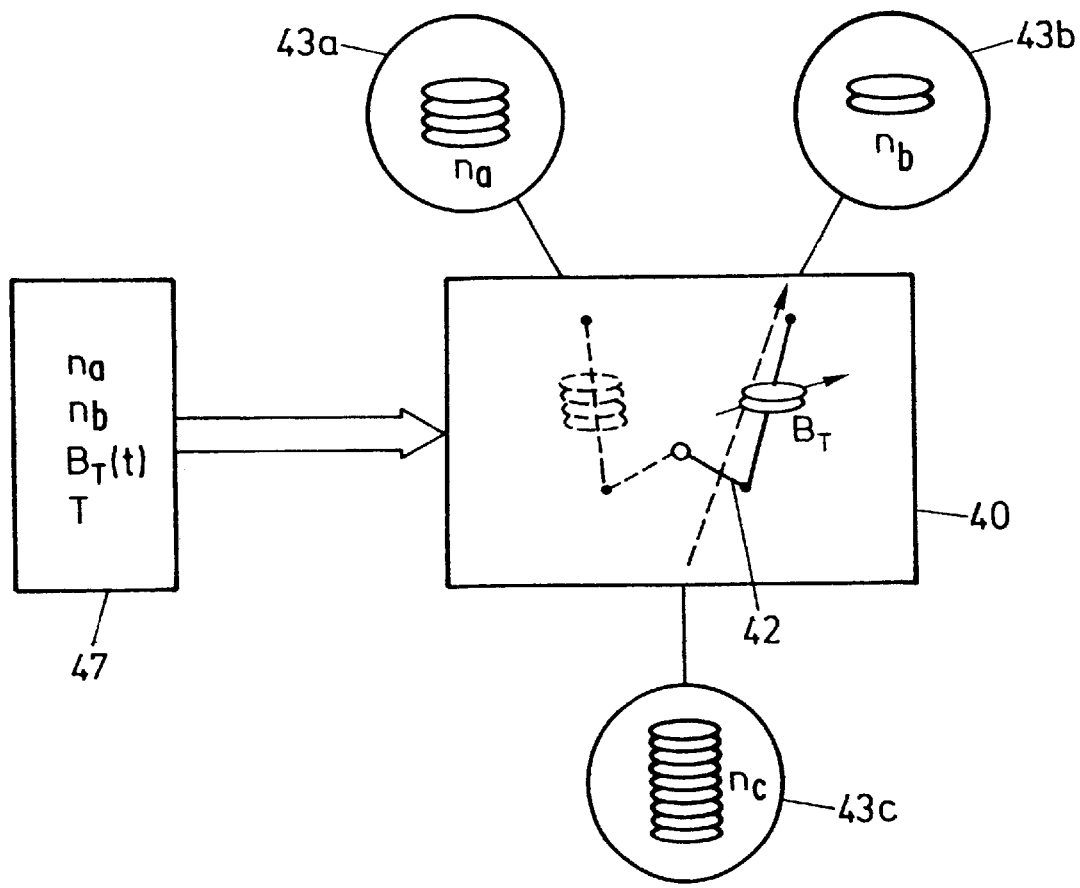
FIG. 4 in a schematic diagram analogous to FIG. 1, a system working according to the process described by the invention, in which stations of different station batch size are served by transport batches, the size of which is controlled during the process.

Let us assume that according to FIG. 4 the observed vacuum treatment system comprise a transport chamber 40 with a schematically shown transport robot 42. Several vacuum stations 43a to 43c are connected to transport chamber 40 as illustrated. The illustrated vacuum stations $43_x$ are designed to accommodate station batches in different batch sizes $n_a$, $n_b$ and $n_c$ respectively. The workpieces are transported between vacuum stations 43 in batch mode, that is, robot 42 is able to pick up one workpiece batch $B_T$ in one of the vacuum stations and to supply it to one of the others. To optimally accommodate the varying capacities of the receiving stations 43, the transport batch size is varied by the process controller as illustrated schematically in FIG. 4 so that, for example, from a large batch $n_c$ in station 43c a batch of the size $n_b$ can be supplied to station 43b and a batch corresponding to batch size $n_a$ to station 43a as indicated by the dotted line.

As the proposed systems in its basic configuration shall be flexibly adaptable to the application requirements with respect to number, type and design of the installed vacuum stations, also the station batch sizes for which corresponding vacuum stations are configured, that is, the variables $n_a$, $n_b$ according to FIG. 2 or 4 and/or the transport batch size $B_T$, that is, $B_{a1}$ to $B_{a2}$ according to FIG. 2, whether fixed or controllable during the operation of the system, are freely definable by the process control 47 assigned to the overall process. For this purpose FIG. 2 contains a process control 27 on which the time sequence T in which stations 30 are served and/or the station batch sizes n of the vacuum stations to be provided and/or the transport batch sizes B to or from the vacuum stations to be provided are freely programmable. With the process control 47 in FIG. 4 the handling sequence T of stations 43 and/or their station batch sizes n and/or the transport batch sizes $B_T$ to be controlled are freely definable depending on the overall system to be configured.

After the basic principles according to the invention with respect to the processes according to the invention have been explained by FIGS. 1 to 4 in such a way that a professional can readily realize this concept within the framework of his skills, in particular with respect to the process control, additional figures in a simplified and partially diagrammatic form introduce examples of system in which said process principles are implemented individually or in any combination.

Figure 5:
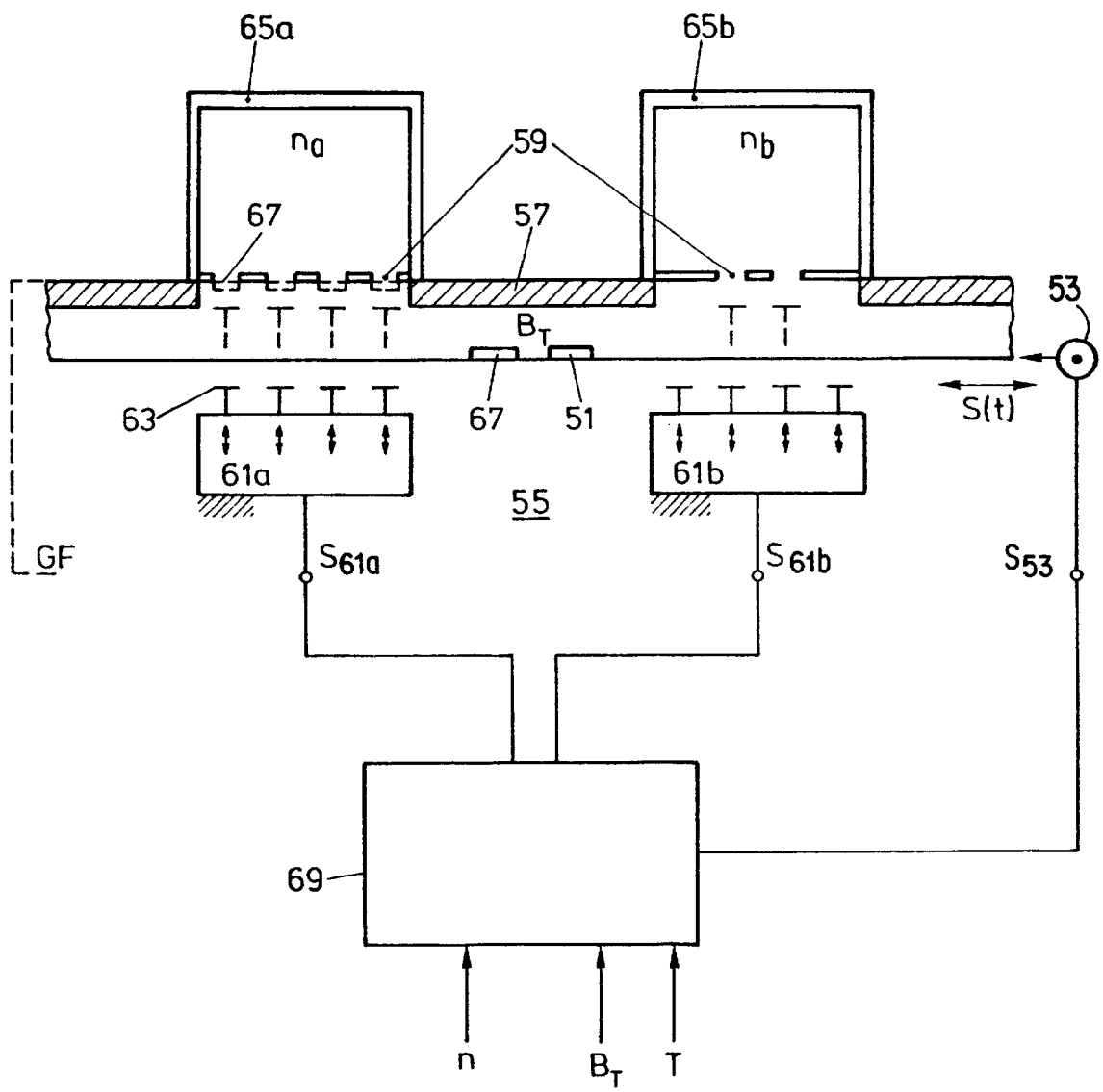
FIG. 5 in a schematic diagram a section of a first system according to the invention designed as a linear system working according to the process that is the subject of the invention.

FIG. 5 schematically shows a linear system in which the following basic principles according to the present invention are implemented:

The time sequence T with which workpieces can be supplied to batch treatment stations is freely definable by means of a process controller.

vacuum stations are provided for station batches of different sizes, and the transport to or from these stations takes place with transport batches $B_T$.

The size of the transport batches is controllable.

The number of workpieces that corresponds to the station batch size of the vacuum stations to be provided, can be freely defined by the process controller.

Also the one or several transport batch sizes or their time sequence may also be freely definable with a process controller.

Also only individual principles or a combination the principles according to this invention may, of course, be implemented on said linear system which shall be described with the aid of FIG. 5.

The basic configuration of the system schematically shown in FIG. 5 comprises a driven reciprocal linear conveyor 51 with drive unit 53 and corresponding control input $S_{53}$. The basic system configuration suggested with dotted lines at GF also comprises transport chamber 55 with the one illustrated boundary wall 57 at which appropriate work openings 59 for flanging vacuum stations are provided. At least some of the work openings 59 which are part of the transport arrangement in transport chamber 55, are assigned a push rod arrangement 61a and 61b respectively.

The transport push rod units 61 features transverse transport push rods 63 that can be extended and retracted independently of each other. For controlling which of the push rods 63 on push rod arrangements 61 are to be extended or retracted and for controlling the time sequence in which such movements are to occur, the arrangements 61 are controllable as schematically indicated with control input $S_{61a}$ and $S_{61b}$ respectively.

Depending on the application and the intended sequence of workpiece-treatment steps, the required vacuum stations 65a, 65b are flanged to the openings 59 of the basic configuration of system GF as needed; the openings that are not required are sealed off with covers (not shown). For example, station 65a can be a CVD coating station whereas station 65b can be a sputter etch station. If designed as a CVD coating station, for example, station 65a allows batch processing of a station batch of size $n_a$ as exemplified in the diagram and viewed in only one dimension where, for example, $n_a$ can be four workpieces 67. If designed as a sputter etch station, for example, and due to the limited effective distribution of the sputter etching process, for example, station 65b is designed for processing one station batch with a workpiece count $n_b$, which, for example, is smaller and as shown in one dimension comprises, for example, 2 workpieces. The linear conveyor 51 allows the push rods 63 to reach transversely through it so that the workpieces 67 it conveys can be lifted up to or retrieved from the work openings 59 or the stations flanged to them, and also hold them in the treatment position for the duration of the process without impeding the reciprocal mobility of the linear conveyor 51.

The basic configuration GF features a process control unit 69 at which the planned transport batch sizes $B_T$ can be freely defined, together with the desired operating sequence T of the linear conveyor 51 based on the station batch sizes n. Of course, only as many variables are entered as are needed to void the overall process control from becoming super-determinate.

As can be readily seen such a system configuration can be designed highly flexibly and for a large variety of requirements and through the adaptation of the transport sequence and/or transport batch sizes, different batch sizes n in the provided vacuum stations can be accommodated.

It is evident that these explanations allow the professional a multitude of variations. For example, it is feasible to implement only one of the illustrated transport push rod arrangements 61 but to equip them with a controlled switched power stage and a drive that provide mobility independently of the linear conveyor 51. It is essential that the workpieces or workpiece batches, once they have arrived in the treatment position at the corresponding stations, remain in this treatment position independently of the action of the push rod arrangement 61 until they are practically picked up again by the now mobile push rod arrangement 61, be it as a complete batch or as "portions" in the form of smaller transport batches. In another versions of the linear system illustrated in FIG. 5 a push rod arrangement 61 is moved linearly along the openings 59 instead of the linear conveyor 51, and serves these openings with a definable batch size in accordance with the required station batch sizes.

Figure 6:
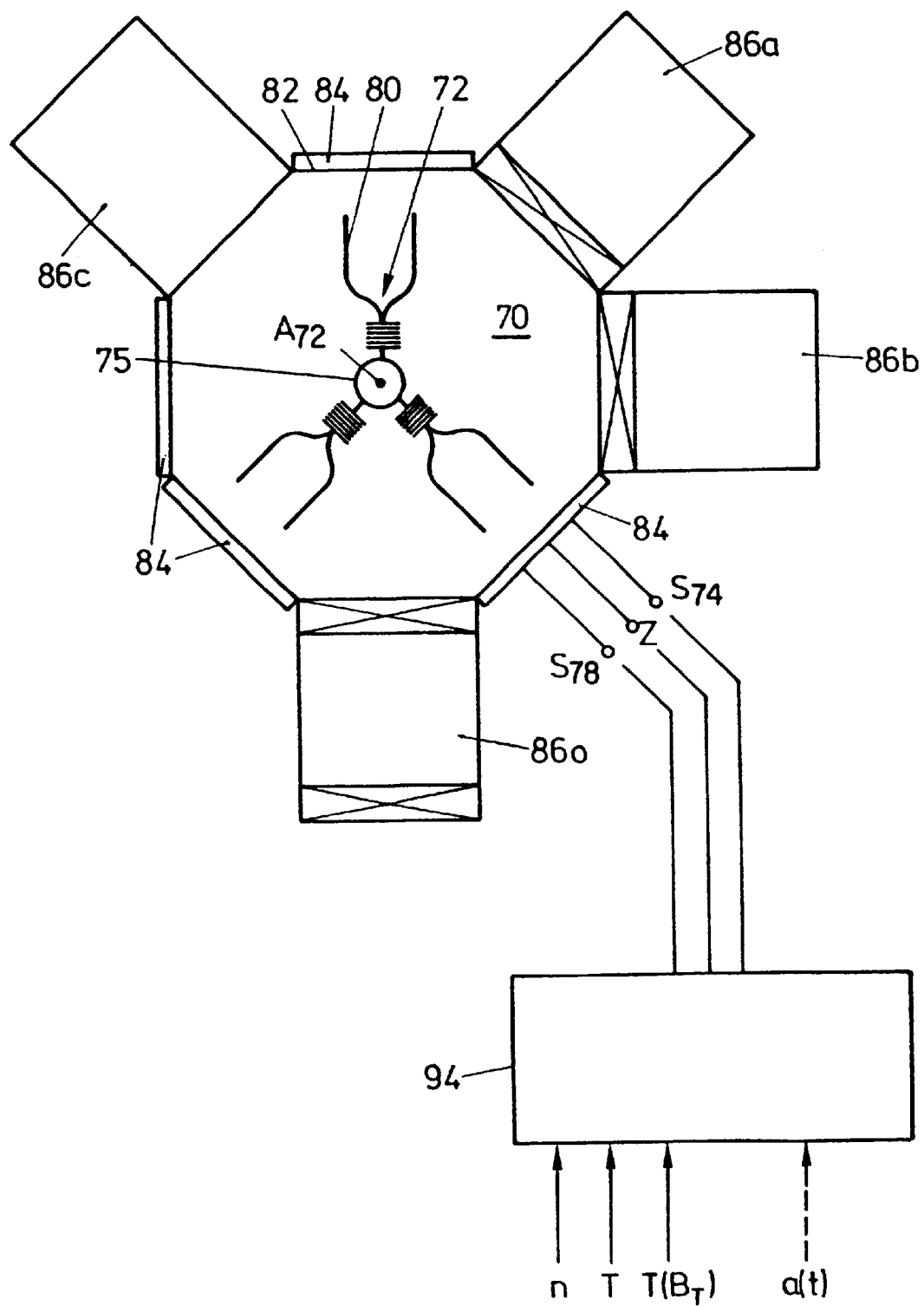
FIG. 6 in a schematic diagram another design version of a system working according to the process that is the subject of the invention.
Figure 7:
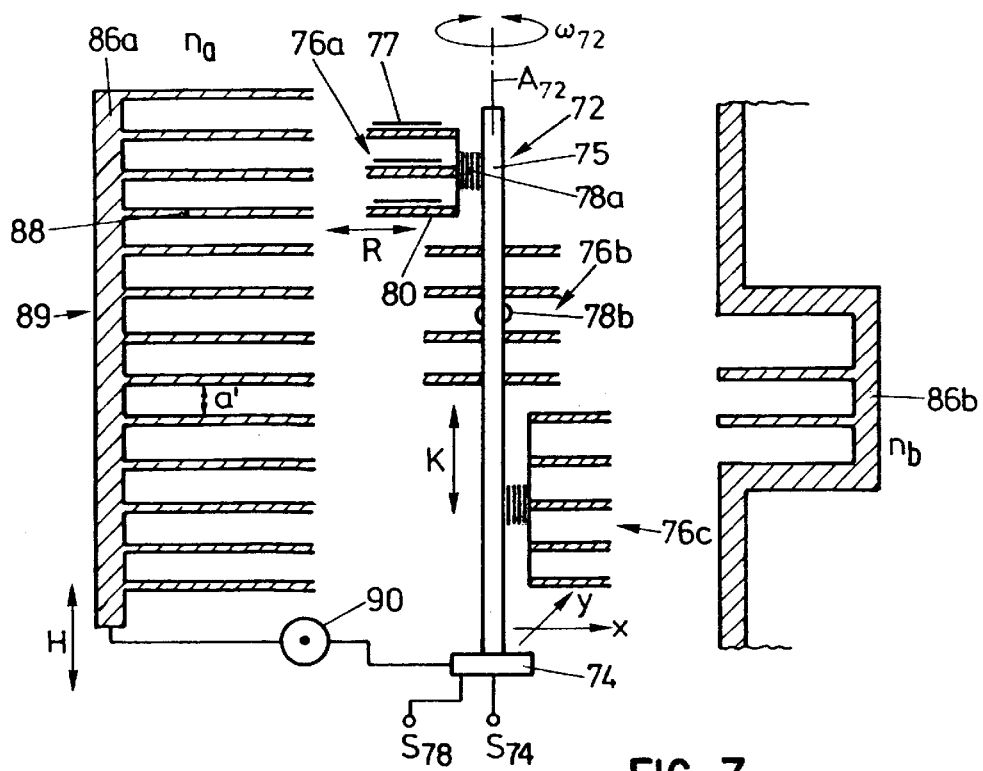
FIG. 7 in a schematic diagram a partial longitudinal view of a system according to FIG. 6.

In FIGS. 6 and 7 another system according to the invention is illustrated, in this case a circular system. As will be explained all aforementioned basic principles can also here be implemented individually or in any desired combination. The basic configuration of this system, particularly as illustrated in FIG. 6, features a transport chamber 70 in which a transport robot 72 is installed. It can be rotated by a motor around its axis $A_{72}$ in controllable angles for which purchase a control input $S_{74}$ is provided on rotary drive 74 as illustrated in FIG. 7

Two or more batch carriers 76 made of workpiece holders 80 are distributed azimutally around the axis of rotation $A_{72}$ or a carrier 75. As illustrated in FIG. 7 a first batch carrier $76_a$ has a capacity for accommodating a batch of three workpieces 77. With respect to carrier 75, batch carrier $76_a$ is, for example, radially extendable and retractable by means of a sealed linear drive $78_{aR}$, as indicated with the double arrow R in FIG. 7. A second batch carrier $76_b$ accommodates one batch of four workpieces and can also be radially extended or retracted by means of a sealed drive 78b. I may be mounted on the support 74 in an angularly staggered fashion, which depending on the stroke of the sealed drives 78, is not mandatory. In the illustrated example a third batch carrier $76_c$ is mounted on support 74, again optionally in an angularly staggered manner.

As schematically shown in FIG. 7 control input $S_{78}$ is provided for controlling the extension and retraction movement of the drives 78. In the basic system configuration several work openings 82 are again provided to which either vacuum stations or if required also normal pressure stations can be flanged and where the unused work openings, as shown at 84, can be sealed vacuum tight by means of covers.

As has been explained, FIG. 7 shows a transport robot 72 at which batch carriers 76 can be extended or retracted via the radial drives 78. For depositing the workpieces 77 in the corresponding vacuum stations 86, there on workpiece carrier 88, a relative movement corresponding to the removal or pick-up stroke H of FIG. 7 is initiated between robot arrangement 72 and stations 86. A movement with a relatively long stroke must also occur in this direction corresponding to K in FIG. 7 if, for example, batch carrier 76a picks up at one of the stations 86a a batch that needs to be deposited in another station 86b which is located further down. As schematically indicated these movements are executed by a controlled relative drive 90 where, of course, robot 72 as well as the provided stations 86 are designed in such a way that they are movable relative to each other in this direction in accordance with the requirements. If, as indicated with the radial drives 78, the corresponding transport batch carriers 76 are sufficiently extendable in direction R, it may possibly not be necessary to have additional mobility of the robot arrangement 72 in the x/y direction according to FIG. 7.

Figure 8A:
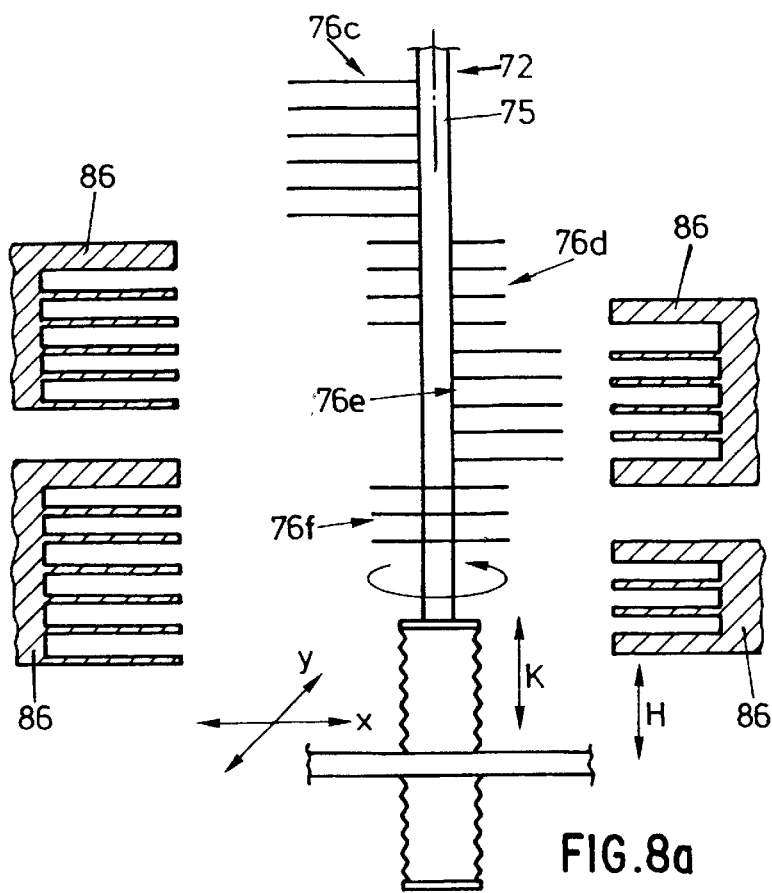
FIG. 8a another design version of a transport robot arrangement that can be used in a system of the type shown in FIGS. 6 and 7.

FIG. 8a shows a design version of the robot arrangement 72 in which the transport batch carriers 76c to 75f are rigidly mounted to support 75 in an angularly staggered fashion. With stroke K the transport batch carriers are moved to the required operating height, and with short stroke H the workpieces are subsequently removed from or deposited in the corresponding stations. Due to the lacking radial expandability the robot arrangement 72, as indicated by x/y and controlled as a function of the spatial arrangement of station 86, is moved in the x/y plane.

In the design version of the robot arrangement 72 according to 8b each of the provided workpiece holders 80 on support 75 is extendable or retractable individually under control of an assigned radial drive $78_o$. This allows highly flexible configuration of batch carrier 76 similar to the design version shown in FIG. 7 and to change the configuration also variably during operation by extending to or retracting the required number of single workpiece holders 80 from the joint transport batch transfer arrangement.

Also here a controlled large stroke K for serving the stations arranged along various heights is needed, and for picking up or depositing the individual workpieces a controlled small stroke H is provided. In this constellation the necessary mobility of the robot arrangement 72 in the plane perpendicular to axis A72, that is, in the directions x/y, may possibly not be needed.

Figure 8B:
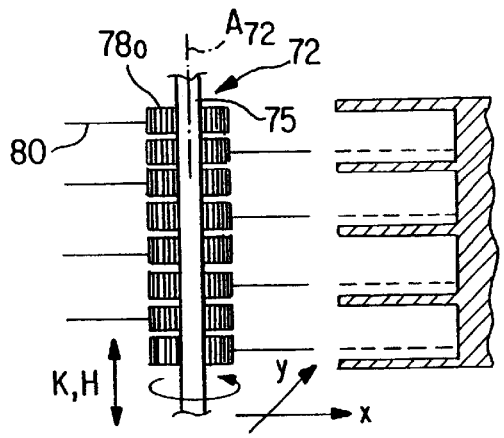
FIGS. 8b, 8c, 8d additional design versions of robot arrangements of this type, for freely variable transport batch sizes (FIG. 8b), for freely variable pitch width (FIG. 8c), for combined implementation of freely variable pitch width selection and freely variable transport batch size selection (FIG. 8d)
Figure 8C:
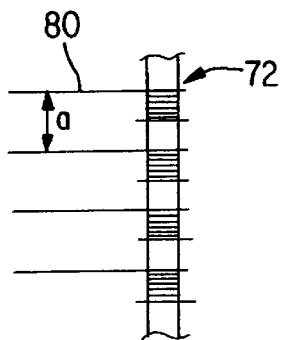
Figure 8D:
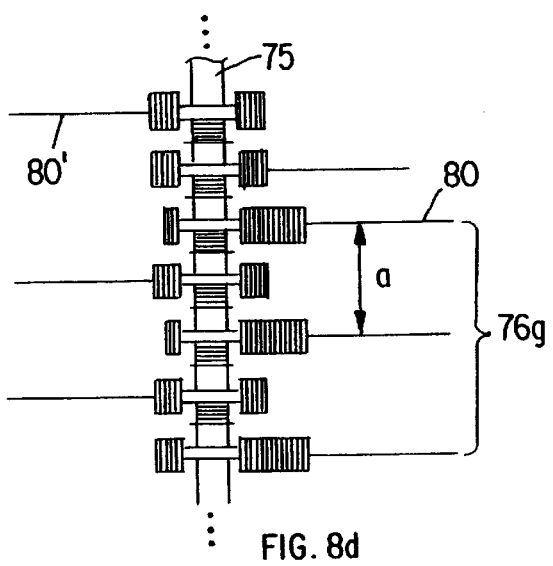

FIG. 8c shows a robot arrangement 72 in which the distance a between the batch carrier and workpiece holders 80 can be flexible set and can also be defined with the system configuration, be it fixed or variable during the process. In this way stations can be served at which, for example, as implied by FIG. 7, the corresponding single workpiece holder distance a' can be different. Of course, the implementation of variable and controllable single workpiece holder distances according to FIG. 8c can be combined with all the versions shown in FIGS. 7, 8a and 8b. In FIG. 8d, for example, the highly flexible combination of the design version according to FIGS. 8b and 8c is shown. Three of the six illustrated workpiece holders 30 are jointly extended to a transport batch carrier 76g and thereby the single workpiece holder distance is reduced, whereas the other three workpiece holders 80' are inactive and wait for their assignment.

Of course, this opens to the professional a large variety of possible implementation versions as to how different transport batch carriers can be flexible combined on a robot arrangement, and how the necessary movements can be implemented in addition to those for batch pickup and delivery to and from the desired stations. The basic proposal according to the present invention is to make the transport batch size definable, be it fixed or variable during system operation, and if necessary to vary also the so-called pitch width on the robot and/or if necessary also on the station batches, for example, the workpiece holder distance a shown in FIG. 8d.

Let us return to FIG. 6 and assume a basic system configuration with an exit vacuum lock 86b as well as, again solely for the purpose of giving an example, two workpiece treatment chambers such as two PECVD chambers 86a and 86b in addition to a heating or cooling chamber 86c.

According to FIG. 7 one of said stations or chambers 86, e.g. station 86a, shall have, for example, a batch capacity $n_a$ of twelve, the batch capacity of chambers 86b, nb shall be, for example, three whereas the batch size on one an additional chamber shall be, for example, five, etc. The workpieces of the corresponding batches in chambers 86 are, as illustrated, deposited on the individual workpiece holders 88 where the batch pick up or batch removal from an adjacent station 86 is performed by retracting workpiece holder 80 by means of the assigned drive 78 on the robot arrangement 72 into the observed chamber 86, and deposited on the batch carriers 89 of chamber 86, for example, through the relative lifting movement H of the observed chamber 86 relative to the robot arrangement 72. The transfer is performed through the lifting movement of the robot arrangement relative to chamber 86. The transfer movements H are implemented through the movement of chambers 86 and/or the robot arrangement 72.

As shown in FIG. 7 a transport batch size of three workpieces can be picked up from the illustrated twelve workpieces, for example, from chamber 86a with a batch size $n_a$ using robot arrangement 72 by extending transport batch carrier 76a. Through controlled lowering—K stroke—(drive not shown) of robot 72 the transport batch carrier 76a is aligned with the destination station 86b and positioned opposite its pick up opening by the rotary movement of robot arrangement 72. With drive 78a the batch of three is transferred to station 86b. Of course, it is easily possible to transport essentially simultaneously several transport batches with the robot arrangement 72.

As can be seen from FIG. 6 the system is equipped with the previously mentioned control inputs $S_{78}$ for the installed radial drives 78, control inputs $S_{74}$ for the angle of rotation increments corresponding to $\omega_{72}$ of FIG. 7, as well as control inputs Z for the relative strokes H or K between robot arrangement 72 and the corresponding chambers 86.

A process controller 94 is provided at which as part of the system configuration procedure the station batch sizes assigned to the corresponding vacuum stations, the sequence T with which the corresponding stations are to be served, and possibly the corresponding transport batch sizes $B_T$ are entered, where the optimum transport batch sizes $B_T$ are preferably calculated automatically by the process control unit 94 based on the specified station batch sizes and the station operation sequence found to the optimal.

The principle followed here is that on a robot arrangement a relatively large number of workpiece holders is provided which can be selectively controlled and combined into transport batch carriers through selective activation of the assigned radial drives 78 for which purpose the pitch size or even its change pattern a(t) is freely definable.

Figure 9:
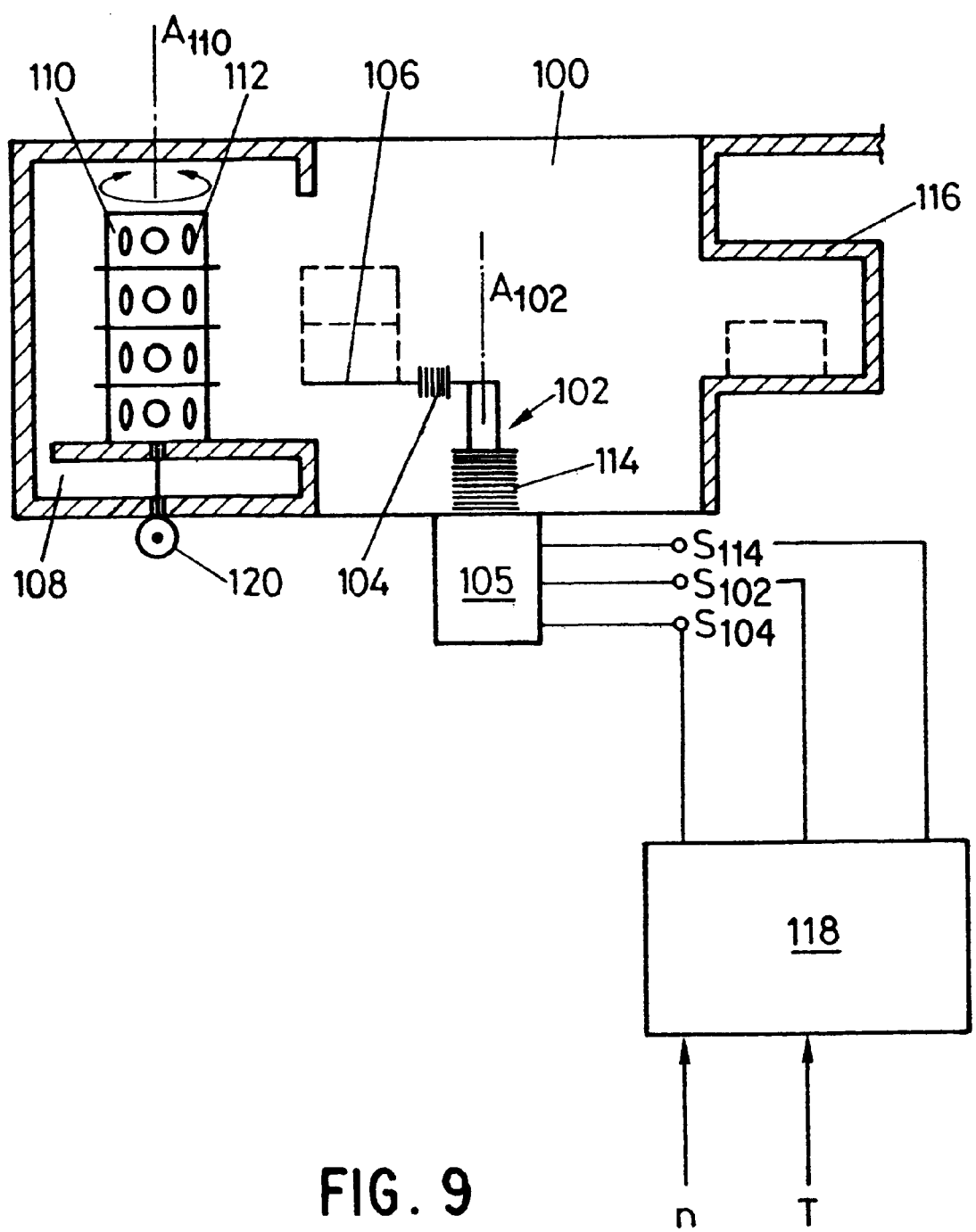
FIG. 9 in a schematic diagram another design version of a system working according to the process that is the subject of the invention, in which the batches are handled in batch magazines.

Another system according to the invention in which all principles which form the basis of the present invention have been realized, be it individually or in any desired combination, is illustrated schematically in FIG. 9. Also this system can be realized in accordance with all the aforementioned basic principles of this invention. Whereas in the design versions discussed so far the workpieces that form a batch have been described as being transported individually, the system according to FIG. 9 is designed to accommodate and transport batch magazines containing individual workpieces which is, of course, also possible with the systems described above. In view of the explanations given so far the system illustrated in FIG. 9 does not require a very detailed description. The basic configuration again comprises a transport chamber 100 with transport robot 102 and a number of work openings in the wall of transport chamber 100. Robot 102 is mounted in the transport chamber in such a way that it can be rotated by a drive around one axis $A_{102}$ under control of the schematically shown control inputs $S_{102}$. A radial drive 104, preferably a linear and sealed drive that is controlled via input $S_{104}$, allows the introduction and retrieval of the pick-up element 106 radially into and from the vacuum stations 108 configured on the basic system configuration in order to operate said stations. Instead of batches assembled from individual workpieces, batch magazines are processed here.

Such a batch magazine as provided in vacuum station 108 shown in the diagram comprises, for example, a carrier drum 110 on the periphery of which several workpieces 112 are held in place. The batch magazines 110 are stackable and with axial drive 114, controllable on control input $S_{114}$, as well as rotary drive 105, controllable at input $S_{102}$ and also radial drive 104, controllable at input $S_{104}$, one two or any number of batch magazine units 110 can be picked up (shown with a dashed line on the receiving element 106) and transported and deposited in the provided vacuum stations, as, for example, station 116 shown in the diagram.

Also here a process control unit 118 is used to which the magazine batch sizes to be processed on the vacuum stations with which the basic configuration of the system is equipped can be freely defined together with sequence T of the operating sequences for the individual vacuum stations, from which process unit 118 determines and outputs the necessary control signals in the correct sequence for the rotary drive of robot 102, radial drive 104 and axial drive 114 respectively. It may possibly be advantageous to have the magazine batch units 110 in one and/or other provided vacuum stations rotate around their axis A110 during the workpiece treatment process which can easily be accomplished by locking stacked batch magazines 110 in such a way that they cannot mutually rotate but that they are axially detachable and can be rotated by means of drive motor 120 provided on the corresponding vacuum station.

This allows treatment of small workpieces such as tools and in particular, for example, milling cutters, reversible tips, drills, general tools for metal cutting or shaping, surface treatment, in particular wear protection coating, or optical workpieces such as eye glasses, lenses, etc.

Figure 10:
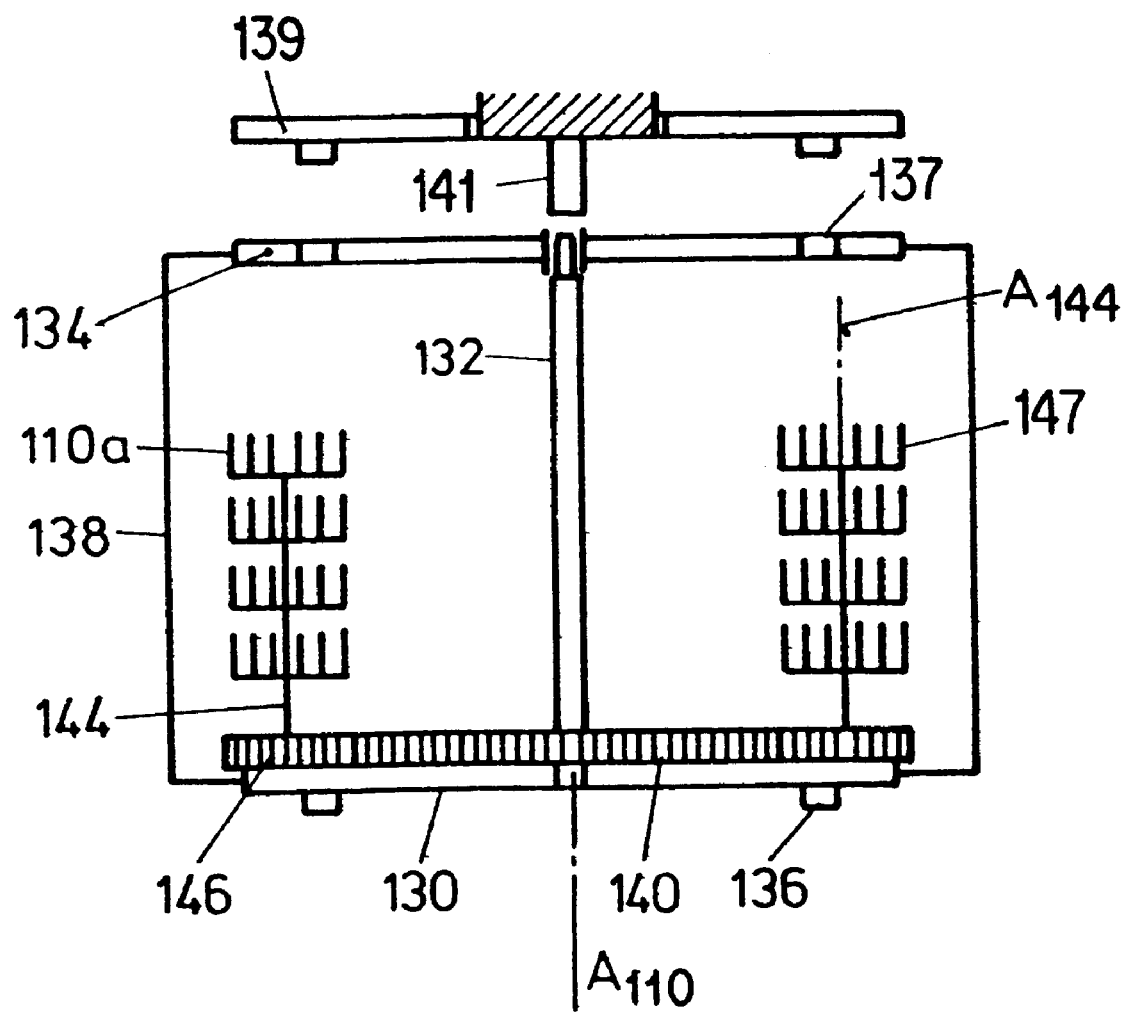
FIG. 10 in a schematic diagram a design version of a batch magazine that is particularly suited to three-dimensional workpieces such as tools, and FIG. 11 schematic top view of another design version of system working according to the process that is the subject of the invention.

FIG. 10 illustrates as an example a batch magazine analogously to the batch magazines 110 of FIG. 9, but for accommodating, for example, milling cutters or drills, etc., that is, generally workpieces that require three-dimensional treatment. Such a unit 110a comprises a cage, consisting of a lower and an upper, preferably circular plate 130 or 134 respectively which is connected torsionally rigid to connecting anchors 138. The plates 134 and 130 have cams or recess links 136, 137 through which they can be coupled to a rotary drive 139 as shown in FIG. 10, or transmit the torque for the rotary movement to all stacked units. A central anchor 132 that has no rotary movement relative to plates 130, 134 is provided which is locked in its position during operation, as shown at 141. On the anchor 132 of batch magazine 110a there is a rotation transmitter such as gear 140, and on the periphery of the lower and/or upper cage plates 130 or 134, carrier trees 144 that can be rotated on gear wheels 146 are provided on which trees a large number of workpieces 147 such as drills, grinders, milling cutters, etc. are held in place. This means that during the treatment all trees jointly rotate around axis A110 together with the cage 130, 134, 138 and in addition each individual tree 144 rotates around its own axis A144.

Figure 11:
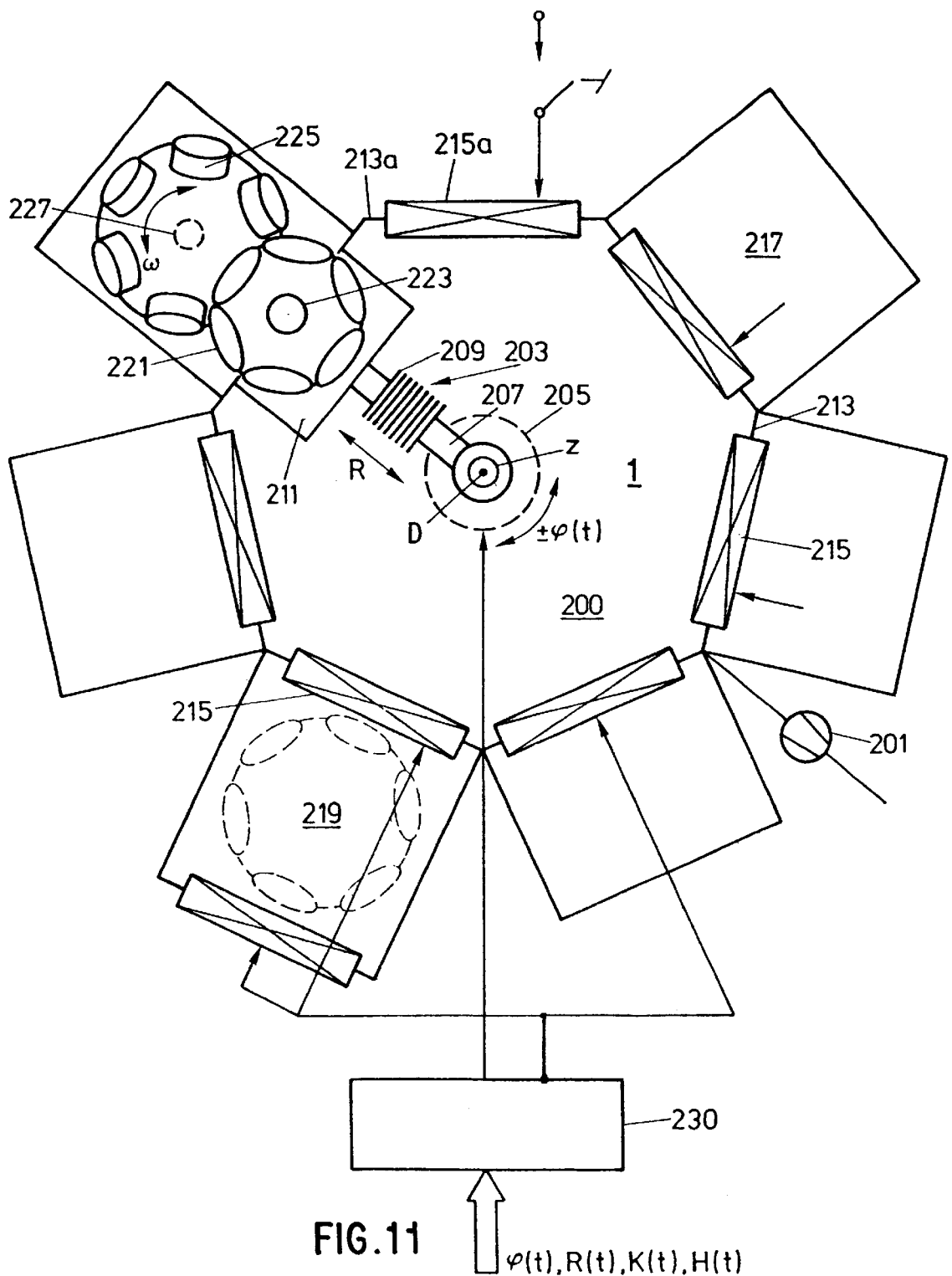

Another system according to the present invention is illustrated in FIG. 11. It comprises at least one transport chamber 200 which can preferably be pumped down via a transport chamber pump arrangement 201. A transport robot is installed inside the transport chamber 200. In the concept illustrated by this diagram the transport robot 203 is mounted in such a way that it can be rotated around axis D by means of drive motor 205 and this robot features an arm 207 that is supported at an oblique angle radially to the axis of rotation D or, as illustrated, a perpendicularly supported arm 207. By means of a linear drive (not shown) that is vacuum isolated by means of a bellows arrangement 209, arm 207 can be radially extended or retracted according to stroke R. A receiving plate 211 is mounted to the very tip of this arm. Robot 203 with arm 207 has essentially the same design as robot 72 in FIGS. 6, 7, 8b.

Distributed along the wall of transport chamber 200 are several (illustrated are 7) pass-through openings 213 which if necessary can be closed by valves 215. Depending on the sequence of treatment steps to be performed, vacuum stations 217 are flanged to the openings 213. The diagram shows, for example, an opening 213a with allocated valve 215a which in the example is not used, as valve 215a is inactive and permanently closed or (not shown) the opening 213a is sealed off with a cover.

The stations 217 can also comprise additional transport chambers for building an extensive transport system for workpiece batches. As shown in the illustrated configuration, for example, a station comprises a load lock and exit vacuum lock 219. The other stations may consist of CVD, PECVD, PVD, heating or cooling stations, depending on the desired process, or, as mentioned, additional transport stations or vacuum lock stations. In the illustrated design the workpieces 221 are loaded into the vacuum lock station 219 on spherical calotte batch magazines 223. After the corresponding valve 215 has opened batch magazine 223 with the six workpiece discs shown as an example, is transferred by vacuum lock station 219 to plate 211 on transport arm 207 where it is fixed. Depending on the selected process or process step sequence the batch is introduced sequentially at stations 217, after the assigned valve 215, if existing, has opened. After batch magazine 223 has been deposited in the corresponding station 217 the arm 207 with plate 211 is retracted and the assigned vacuum lock valve 215 is closed again. As shown at one of the stations 217, several treatment sources, for example, sputter sources 225 distributed, for example, also on a spherical calotte, one each for simultaneous processing or treatment of work pieces 221, are provided in the treatment station.

As shown with a dashed line at 227, it is easily possible also in this case to deposit the magazine 223 on a rotary drive 227 of a station 215 and, as schematically shown with the double arrow ω to rotate the magazine 223 with workpieces 221 during the treatment in such a station.

From the observation of FIG. 11 the professional will readily realize that stations 215 can also be arranged along several great circle planes, perpendicular to the rotational axis D of the robot arrangement, and that in this way also a lifting drive corresponding to K can be provided in accordance with the description, for example, the description to FIG. 7, as well as a short stroke drive corresponding to H for deposit and pickup of the batch magazines 223. In addition the robot can feature several arms 207, possibly with variable pitch analogously to FIG. 8c or 8d so that several batch magazines can be processed concurrently. In place of the individual workpieces, for example, in a system according to FIG. 7, a batch magazine is used as already explained in conjunction with the system according to FIG. 9, and "super batches" comprising several batch magazines can be handled.

In addition a controller 230 is provided at which the time sequence of the angles of rotation $\pm\phi(t)$ of at least one arm 207, the time sequence of its stroke R(t) and if applicable the time sequence of the strokes K(t), H(t) are entered. The process controller 230 also controls the opening and closing movements of the assigned valves 215 as a function of the entered rotation angle sequence, stroke sequence, pick-up and deposition movements. Valves 215 are controlled depending on whether or not vacuum isolation or compartmentalization between the stations and transport chamber 201 and consequently also among stations 217 is required. Work openings on the transport chamber that are not required are kept vacuum tight (215a).

The vacuum stations can consist of any such known stations or partially even stations operated under vacuum conditions such as stations for CVD under atmospheric pressure, or stations for LPCVD, PECVD, PVD including coating stations, etching stations, cleaning stations, conditioning stations, etc. as well as transport stations and vacuum lock stations. Depending on the requirements, the stations are mutually vacuum isolated and in particular with respect to the transport chambers that serve several such stations, to the degree required by the actual process, that is, for example, vacuum tight or via pressure stage seals such as labyrinth seals, etc. The steps to be taken in this request such as appropriate vacuum valves are known.

With the treatment process according to the invention or the equipment operated according to the invention, workpieces such as semiconductor wafers, memory discs, glass substrates used e.g. for the production of active matrix displays as well as basically two-dimensionally planar or three-dimensional workpieces are treated. Three-dimensionally treated are in particular machine components or tools for metal removal and shaping, to which provided in particular wear protection coatings are applied.

Schematically a number of possible system types were introduced to demonstrate, how the basic principles according to the invention are implemented. If goes without saying that with respect to the detail design, in particular also the robot arrangement, many possibilities are available to the professional, depending also on whether a linear or circular system is to be created. In addition it should be emphasized that within the framework of a large-scale production system also only a portion of such a system may in practice be designed and operated as a "system satellite" in accordance with the invention.

What is claimed is:

1. A method for manufacturing surface treated workpieces comprising the steps of
   loading said workpieces into a treatment facility;
   surface treating said workpieces in at least one vacuum station of said facility grouped as a station batch;
   controlling at least the timing of said process with said treating with a freely programmable process controller unit.

2. The method of claim 1, further comprising providing a further station for said workpieces grouped in a further station batch, and selecting the numbers of workpieces of said station batch and of said further station batch to be different.

3. The method of claim 1, further comprising controlling the number of workpieces of said station batch.

4. The method of claim 3, further controlling said number of workpieces with a freely programmable process controller unit.

5. The method of claim 1, further comprising transporting workpieces towards and from said at least one vacuum station grouped as a transport batch.

6. The method of claim 5, further comprising controlling the number of workpieces of said transport batch.

7. The method of claim 6, further comprising controlling the number of workpieces of said transport batch with a freely programmable process controller unit.

8. The method of claim 1, further comprising transporting workpieces towards and from said at least one vacuum station grouped as a transport batch, and further controlling the number of workpieces of said transport batch to be an integer fraction of the number of workpieces of said station batch.

9. The method of claim 1, further comprising providing a further station for a further station batch of workpieces, and transporting workpieces from said further station to said at least one vacuum station grouped in a transport batch and controlling the number of workpieces of said transport to be an integer fraction of the number of workpieces of said further station batch.

10. The method of claim 1, further comprising transporting workpieces between said vacuum station and a further station of said facility grouped as a transport batch.

11. The method of claim 10, further comprising of controlling said transport batch.

12. The method of claim 1, further comprising providing said workpieces in said stations within a mobile magazine.

13. The method of claim 12, further comprising transporting said workpieces to and from said stations within said mobile magazine.

* * * * *